(12) United States Patent
Jung et al.

(10) Patent No.: US 7,271,088 B2
(45) Date of Patent: Sep. 18, 2007

(54) SLURRY COMPOSITION WITH HIGH PLANARITY AND CMP PROCESS OF DIELECTRIC FILM USING THE SAME

(75) Inventors: Jong Goo Jung, Gyeonggi-do (KR); Sang Ick Lee, Gyeonggi-do (KR); Hyung Soon Park, Gyeonggi-do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 180 days.

(21) Appl. No.: 10/999,263

(22) Filed: Nov. 30, 2004

(65) Prior Publication Data

US 2005/0148186 A1    Jul. 7, 2005

(30) Foreign Application Priority Data

Jan. 5, 2004    (KR) ................ 10-2004-0000288

(51) Int. Cl.
   *H01L 21/4763*    (2006.01)
(52) U.S. Cl. .............. 438/633; 438/687; 438/638; 438/693; 257/E21.304
(58) Field of Classification Search ............ 438/633, 438/687, 638, 693
   See application file for complete search history.

(56) References Cited

U.S. PATENT DOCUMENTS

2002/0037642 A1* 3/2002 Wake et al. .......... 438/633

FOREIGN PATENT DOCUMENTS

JP    2003-082380       3/2003
JP    2003-082380 A  *  3/2003

OTHER PUBLICATIONS

Official Action dated Oct. 31, 2005, issued by the Korean Intellectual Property Office, in connection with the Korean counterpart application.

* cited by examiner

*Primary Examiner*—Asok K. Sarkar
*Assistant Examiner*—Victor V. Yevsikov
(74) *Attorney, Agent, or Firm*—Marshall, Gerstein & Borun LLP

(57) ABSTRACT

Disclosed herein are a CMP slurry composition with high-planarity and a CMP process for polishing a dielectric film using the same. More specifically, a CMP slurry composition with high-planarity includes a carbon compound having tens of thousands of carboxyl groups and having a molecular weight ranging from hundreds of thousands to millions, an abrasive, and water. A CMP process for polishing a dielectric film utilizes the disclosed slurry composition. The slurry composition enables complete and overall planarization of the dielectric film by polishing the part of the film having a higher step difference through CMP process. Accordingly, the disclosed slurry composition is useful for the CMP process of all semiconductor devices including those having ultrafine patterns.

14 Claims, 4 Drawing Sheets

SLURRY COMPOSITION WITH HIGH PLANARITY AND CMP PROCESS OF DIELECTRIC FILM USING THE SAME

BACKGROUND OF THE DISCLOSURE

1. Field of the Disclosure

The disclosure generally relates to a slurry composition with high planarity and a chemical mechanical polishing (CMP) process of a dielectric film using the same. More particularly, the disclosure relates to a high-planarity slurry composition comprising water, an abrasive, and an anionic polymeric carbon compound including a plurality of carboxyl groups, and a CMP process of a dielectric film using the same.

2. Description of the Related Technology

In fabrication of semiconductor devices, if planarity of each layer in the multi-lines is not good enough, it exerts adverse effects on the contact between the lines. As the width of circuit lines become thinner, it has become more difficult to obtain a plane wafer by a conventional etch-back or reflow process. Therefore, there has been a need for a new planarization process and a new wafer polishing process combining a mechanical process and a chemical process called chemical mechanical polishing (abbreviated as CMP), which was developed by IBM Company in the late 1980's. A deformed layer formed by a conventional mechanical polishing process can be a flaw on a semiconductor chip. In addition, although the deformed layer is not formed by a chemical polishing process, a flat pattern (i.e., pattern accuracy) cannot be achieved; instead, only a simple flat surface can be obtained. The basic concept of the CMP process is to polish a wafer by combining advantages of the above-described two processes.

As described above, the planarization process is necessarily required in fabrication of semiconductor devices, and such process includes resist etch back process, spin on glass (abbreviated as "SOG") process, boro-phospho-silicate-glass (abbreviated as "BPSG") reflow process, and CMP. Among them, CMP has been known to have a planarization range larger by 100 to 1,000 times those of other planarization processes.

A wafer is polished by a pad and slurry in the CMP process. However, the wafer is not completely planarized in the CMP process using conventional slurry. The degree of planarity (abbreviated as "DOP") of the CMP process, which is generally defined by Equation 1 (below) cannot reach 1 through a removal of a step difference by the conventional CMP process. If a step difference still exists after the CMP process, a margin shortage of the depth of focus (abbreviated as "DOF") in a subsequent exposure step and a margin shortage in an etching step induce a bridge formation or increase a leakage current, thereby causing the device to fail. Particularly, the margin shortage in a subsequent self-aligned contact (abbreviated as "SAC") process affects the device fail when the wafer is not completely planarized in an inter layer dielectric (ILD) CMP process of a DRAM fabrication.

$$\text{Degree of Planarity} = 1 - \frac{SH_f}{SH_i} \quad \text{[Equation 1]}$$

In Equation 1, $SH_i$ is the abbreviation for initial step height, which represents a step difference before the CMP process, and $SH_f$ is the abbreviation for final step height, which represents another step difference after the CMP process. When the $SH_f$ is 0, then the DOP becomes 1, meaning complete planarization is achieved.

FIGS. 1a to 1c show the conventional CMP process. Pattern 1 is formed through a photo-etching process in the fabrication of a semiconductor device, and a region where the pattern is not formed is filled with an dielectric film 2 (see FIG. 1a). Herein, in order to remove step difference t1, a CMP process using abrasive 3 and pad 4 is conducted (see FIG. 1b). However, step difference t2 still remains after the CMP process was completed (see FIG. 1c).

When the step difference is removed by conventional CMP process, the degree of planarity cannot exceed 0.7 at its maximum due to various factors such as dielectric film deposition characteristics before the CMP process, degree of elasticity of the pad, characteristics of slurry and non-uniformity in the polishing process. In other words, the conventional method cannot decrease the step difference by more than 70% of the initial step height $SH_i$ and about 30% of the initial step height remains after the CMP process. As a result, it is difficult to apply the conventional method to a semiconductor device having fine circuit pattern, such as a device having a circuit line width of less than 100 nanometers (nm).

SUMMARY OF THE INVENTION

Accordingly, disclosed herein is a novel slurry composition for a CMP process with high-planarity comprising an anionic polymeric carbon compound capable of forming a complex with a cationic metal compound into a conventional CMP slurry comprising water and an abrasive, and a method for polishing the surface of a dielectric film using the slurry composition to obtain high planarity surface without step difference.

In one embodiment, there is provided a novel slurry composition for a CMP process of oxide film, the slurry comprising a carbon compound having tens of thousands of carboxyl groups and having hundreds of thousands to millions of molecular weight, an abrasive, and water.

Also, there is provided a method for polishing surface of a dielectric film nearly without step difference using the above-described CMP slurry composition.

Additional features of the invention may become apparent to those skilled in the art from a review of the following detailed description, taken in conjunction with the drawing figures, the examples, and the appended claims.

BRIEF DESCRIPTION OF THE DRAWINGS

For a more complete understanding of the invention, reference should be made to the following detailed description and accompanying drawings wherein.

Figure 1A:
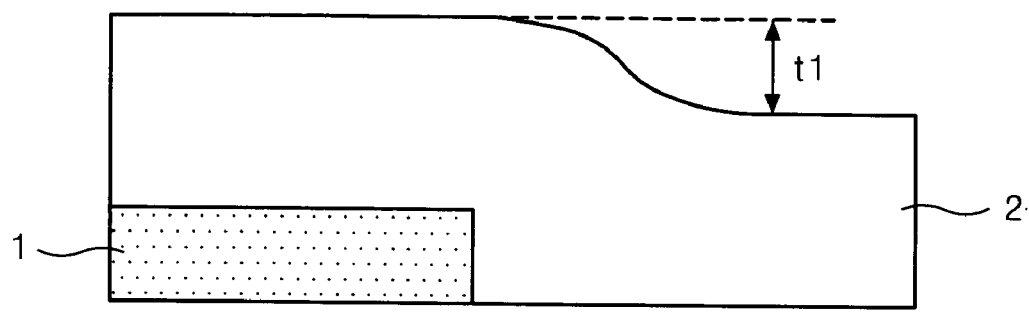
FIG. 1a is a diagram illustrating a step difference generated after pattern formation and deposition of a dielectric film.
Figure 1B:
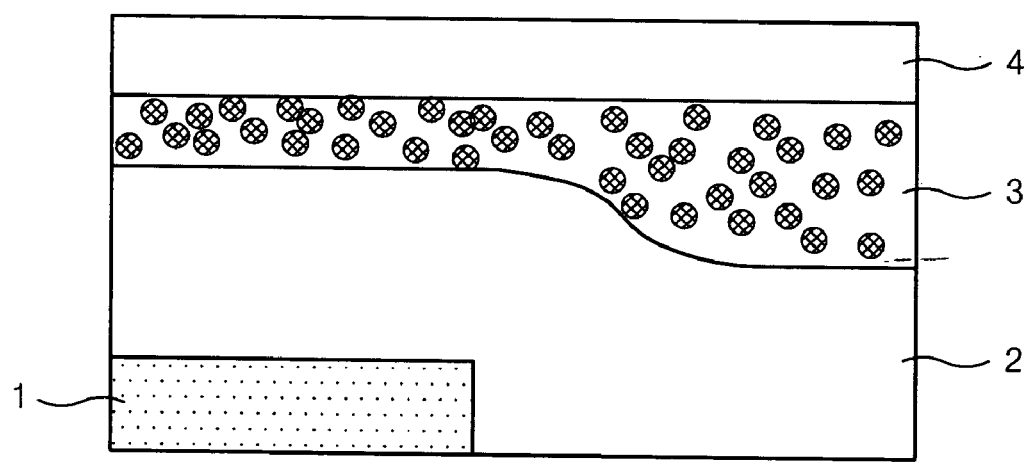
FIG. 1b is a diagram illustrating the mechanism where an abrasive polishes a film chemically and mechanically between a pad and a wafer.
Figure 1C:
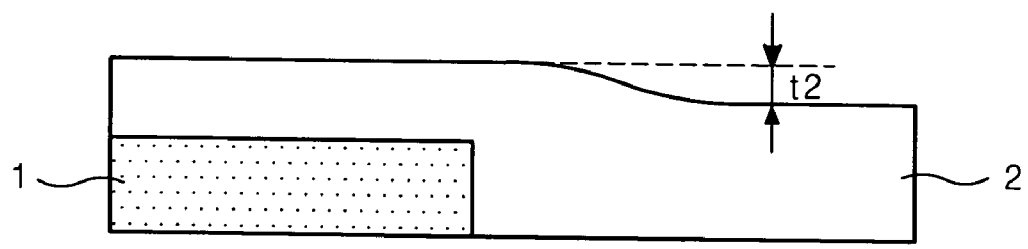
FIG. 1c is a diagram illustrating the state after a conventional CMP process.

While the disclosed invention is susceptible of embodiments in various forms, there are illustrated in the drawings (and will hereafter be described) specific embodiments of the invention, with the understanding that the disclosure and drawings are intended to be illustrative, and are not intended to limit the invention to the specific embodiments described herein.

DETAILED DESCRIPTION OF THE PREFERRED EMBODIMENTS

There is provided a novel CMP slurry composition for a CMP process of oxide film with high-planarity, the slurry comprising a carbon compound having tens of thousands of carboxyl groups and having hundreds of thousands to millions of molecular weight, an abrasive, and water.

Figure 2A:
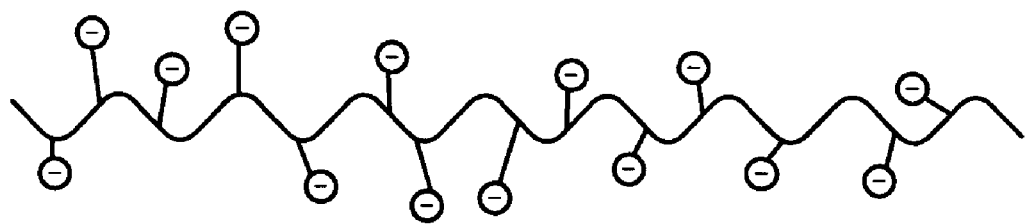
FIG. 2a is a diagram illustrating a polymeric carbon compound included in a slurry composition.

FIG. 2a shows the carbon compound included in the slurry composition of the present invention. The carbon compound has molecular weight ranging from $1 \times 10^5$ to $1 \times 10^7$ and has 1,000 to 100,000 carboxyl groups. The anionic carboxyl group serve as a complex agent-forming complex with a metal element in a solution. The compound exists in an extended chain-form by repulsive forces between anionic carboxyl groups in a basic solution, and forms a complex in the presence of a cationic metal compound. In the composition of the present invention, the carbon compound preferably is one or more anionic polymers selected from the group consisting of poly(acrylic acid), poly(acrylic acid-co-maleic acid), poly(methylvinylether-alt-maleic acid), polyacrylamide, poly(acrylamide-co-acrylic acid), and polyacrylonitrile, or derivatives thereof. Preferably, the carbon compound is the anionic polymer of poly(acrylic acid) and its derivatives. However, the invention is not limited to the above-listed anionic polymers, but all anionic polymers which can form a complex with metal compound may be used as the carbon compound included in the slurry composition of the present invention.

The carbon compound is commercially available, and "CARBOPOL" a product of NOVEON Co., Ltd., is a preferable example for the poly(acrylic acid) or its derivatives. Among them, "CARBOPOL 940" having molecular weight of four million ($4 \times 10^6$) or "CARBOPOL 941" having molecular weight of one and a quarter (1.25) million ($1.25 \times 10^6$) can be more preferably used. In addition, all kinds of anionic polymers including poly(acrylic acid) compounds of Aldrich Co., Ltd., having similar molecular weights as above may be used as the carbon compound included in the slurry composition of the present invention. Preferably, the polymeric carbon compound is present in an amount ranging from 0.01 weight percent (wt. %) to 5.0 wt. %, more preferably from 0.05 wt. % to 1.5 wt. %, based on total weight of the slurry composition.

Figure 2B:
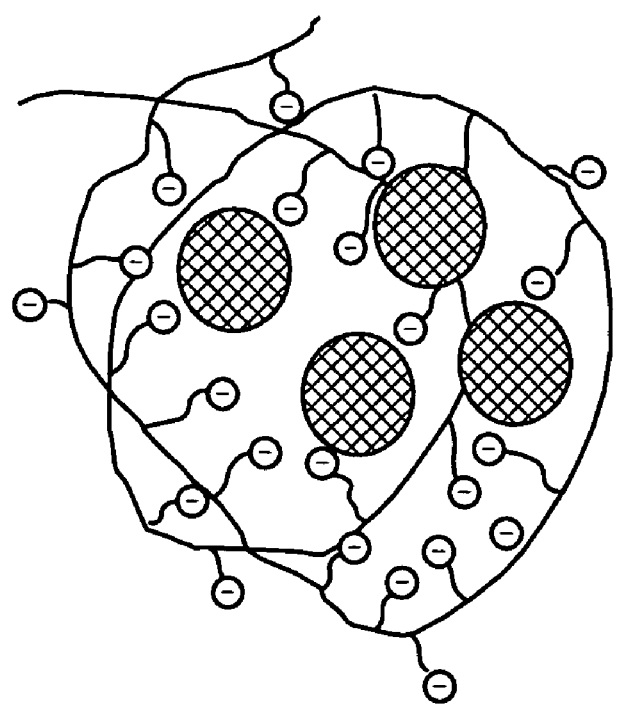
FIG. 2b is a diagram illustrating an abrasive-polymer complex.

There are no specific limitations on the abrasive included in the slurry composition of the present invention, and any of the conventional abrasives for the CMP process can be selected. Preferably, however, the abrasive is selected from the group consisting of ceria ($CeO_2$), colloidal silica ($SiO_2$), fumed silica ($SiO_2$), alumina ($Al_2O_3$), and mixtures thereof. Preferably, the abrasive has a particle size ranging from 30 nanometers (nm) to 1,000 nm, more preferably 50 nm to 500 nm, and can be used in an amount ranging from 0.5 wt. % to 20 wt. %. In a preferred embodiment, the slurry composition has a pH ranging from 5.0 to 8.0, more preferably from 6.0 to 7.5. FIG. 2b shows a diagram illustrating the abrasive-polymer complex.

Meanwhile, a basic compound should additionally be used as a neutralizer so that polymeric carbon compounds, such as poly(acrylic acid) can be activated in the slurry composition. Here, the basic compound may be ammonium hydroxide, a hydroxide of alkali metals, such as potassium hydroxide and ammonium hydroxide, or an organic salt selected from the group consisting of MEA (monoethanol amine), DEA (diethanol amine), and TEA (triethanol amine), and mixtures thereof.

In addition, there is provided a method for polishing surface of a dielectric film without step difference using the above-described CMP slurry composition.

In the method for polishing the surface of the dielectric film, the above-mentioned slurry composition for CMP process with high planarity is used instead of a conventional CMP slurry composition in order to remove a step difference still remaining after conventional CMP process to achieve planarity more than 0.90, preferably more than 0.95 ($t_2 < 0.05 t_1$ in Equation 1). The method includes forming one or more patterns on a substrate, filling dielectric material between patterns to form dielectric film, and performing a CMP process on the entire surface of the formed dielectric film the slurry composition described hereinbefore.

The CMP process can be one selected from the group consisting of shallow trench isolation (STI) CMP process, inter layer dielectric (ILD) CMP process and inter-metal dielectric (IMD) CMP process.

The polishing method of the present invention may be applied to fabrication of semiconductors such as logic devices, memory chips, or non-memory chips, for example.

Figure 3A:
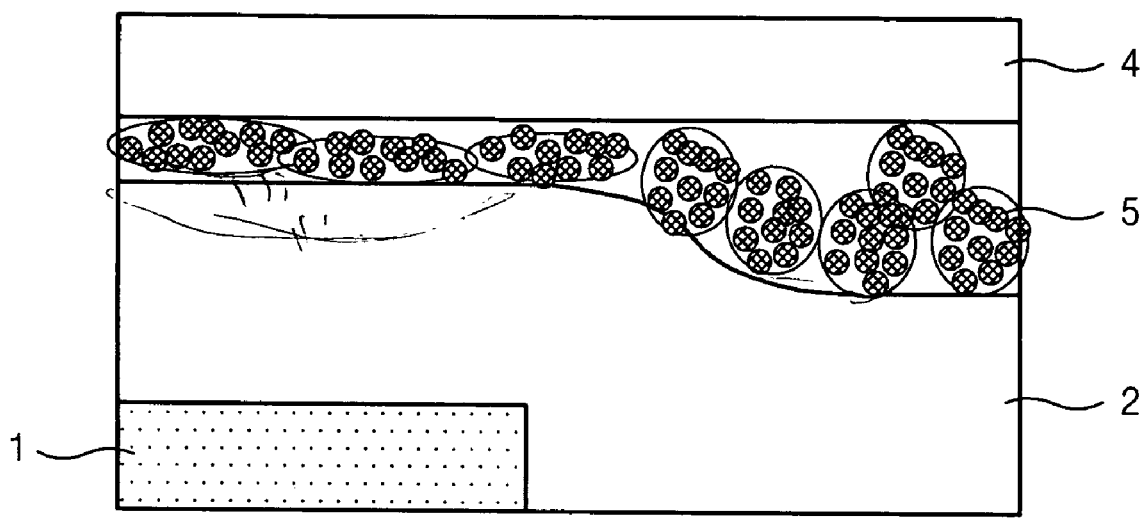
FIG. 3a is a diagram illustrating a process for removing a step difference by the CMP process using a slurry composition of the present invention.

FIG. 3a is a diagram illustrating a process for removing a step difference by a CMP process using a slurry composition of the present invention. In the method of the present invention for polishing the surface of a dielectric film, an abrasive-polymer complex participates in different modes according to the height of the step difference caused by a pattern formation. That is, the abrasive-polymer complex in the region having high step difference is transformed from a circular shape into a wide-spread shape when it contacts directly with a pad under pressure. As pressure is applied to the pad, the number and size of the polishing particles contacting a dielectric film (a film to be polished) becomes relatively larger, i.e., the contact area becomes larger. As a result, the slurry composition removes the high step difference chemically and/or mechanically. However, the abrasive-polymer complex in the region having low step difference has a tendency to keep its original circular shape, and the number of particles contacting the dielectric film (film to be polished) becomes smaller. Since the abrasive-polymer complex absorbs much of an external pressure, the external pressure is not applied to the dielectric film (film to be polished). As a result, the dielectric film in the region having the low step difference is scarcely polished, while the high step difference is removed.

Figure 3B:
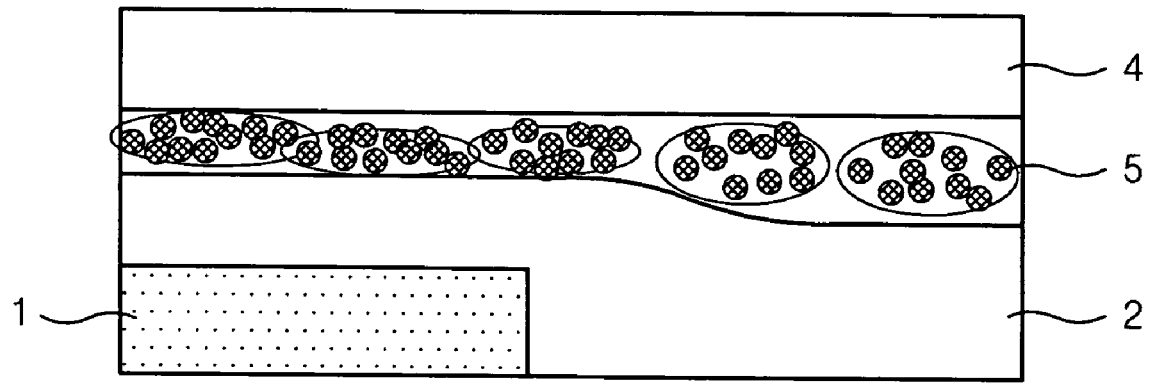
FIG. 3b is a diagram illustrating a state when the removal of the step difference is performed.

FIG. 3b is a diagram illustrating a state when much of the step difference is removed. The region having a low step difference is not polished, and its initial state is kept almost as it was.

Figure 3C:
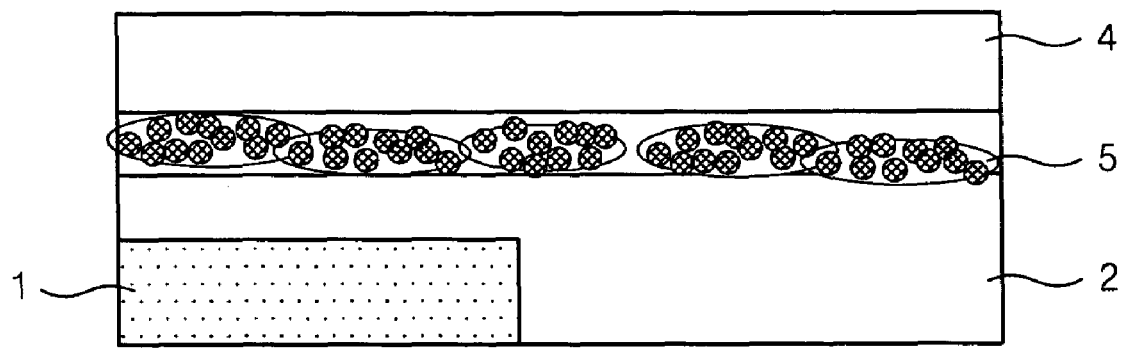
FIG. 3c is a diagram illustrating the state of pad/complex/film to be polished when planarization is almost finished; and, FIG. 3d is a diagram illustrating the state after the planarization is completely finished.

FIG. 3c is a diagram illustrating a state when the initial step difference is completely removed. The abrasive-polymer complex is distributed with a wide-spread shape over the entire region of the interlayer dielectric film. In this moment, since the polishing rate of the dielectric film is relatively slower than that of removing the initial step difference, an AUTO-STOP CMP function can be added. In other words, the slurry compositions of the present invention have a tendency not to easily polish the dielectric film by an external pressure after the initial step difference is completely removed.

Figure 3D:
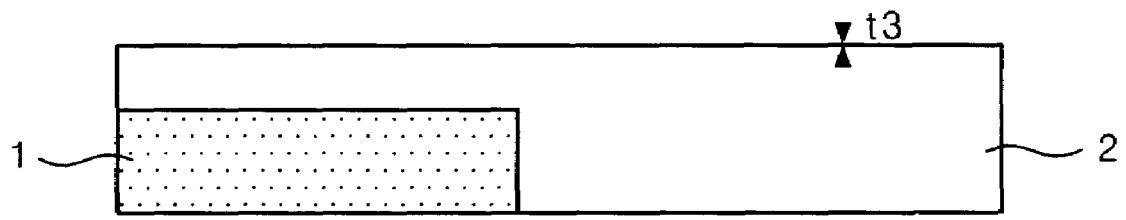

FIG. 3d is a diagram illustrating a state after the planarization is completely finished. The step difference after the polishing process ($SH_f$), $t_3$ is almost 0.

EXAMPLES

Hereinafter, the present invention will be described in more detail referring to examples below, which are not intended to limit the scope of the present invention.

A. Preparation of the Slurry Composition of the Present Invention

Example 1

79 wt. % of deionized water was added to 20 wt. % of a conventional slurry composition including fumed silica ($SiO_2$) having a particle size of 20 nm to 300 nm (for example, HS-8005-HX, a product of Hitachi Co., Ltd., or similar series thereof). Thereafter, 1.0 wt. % of CARBOPOL 940 was added, with stirring to prevent aggregation thereof. The resulting mixture was further stirred for about 30 minutes until it was completely mixed and stabilized, thereby obtaining a slurry composition having a pH of 6.5.

Example 2

69.5 wt. % of deionized water was added to 30 wt. % of a conventional slurry composition including colloidal silica ($SiO_2$) having a particle size of 20 nm to 300 nm (LEVASIL 50CK/30% V1, a product of Bayer Co., Ltd.). Thereafter, 0.5 wt. % of CARBOPOL 941 was added, with stirring to prevent aggregation thereof. The resulting mixture was further stirred for about 30 minutes until it was completely mixed and stabilized, thereby obtaining a slurry composition having a pH of 5.5.

Example 3

48 wt. % of deionized water was added to 50 wt. % of a conventional slurry composition including Alumina having a particle size of 20 nm to 300 nm (SS-25, a product of Cabot Co., Ltd.). Thereafter, 2 wt. % of CARBOPOL 940 was added, with stirring to prevent aggregation thereof. The resulting mixture was further stirred for about 30 minutes until it was completely mixed and stabilized, thereby obtaining a slurry composition having a pH of 7.5.

Example 4

79 wt. % of deionized water was added to 20 wt. % of a conventional slurry composition including $CeO_2$ having a particle size of 20 nm to 300 nm (GPL-C S212, a product of Showa-Denko Co., Ltd.). Thereafter, 1.0 wt. % of CARBOPOL 941 was added, with stirring to prevent aggregation thereof. The resulting mixture was further stirred for about 30 minutes until it was completely mixed and stabilized, thereby obtaining a slurry composition having a pH of 6.0.

B. Polishing Process of Dielectric Film Using the Disclosed Slurry Composition

Example 5

A CMP process on the surface of an interlayer dielectric film was performed with a hard pad at polishing pressure of six pounds per square inch (psi) and at a table revolution rate of 80 rotations per minute (rpm) (Rotary Type CMP equipment) using the slurry composition prepared in Example 1. Herein, the step difference observed was 10,000 Å before the CMP process ($SH_i$), and was decreased to 200 Å after the CMP process ($SH_f$). The degree of planarity obtained by applying the $SH_i$ and $SH_f$ values to Equation 1 was 0.98.

Example 6

A CMP process on the surface of an interlayer dielectric film was performed with a hard pad at polishing pressure of 6 psi and at a table revolution rate of 80 rpm (Rotary Type CMP equipment) using the slurry composition prepared in Example 2. Herein, the step difference observed was 10,000 Å before the CMP process ($SH_i$), and was decreased to 500 Å after the CMP process ($SH_f$). The degree of planarity obtained by applying the $SH_i$ and $SH_f$ values to Equation 1 was 0.95.

Example 7

A CMP process on the surface of an interlayer dielectric film was performed with a hard pad at polishing pressure of 3 psi and at table revolution rate of 80 rpm (Rotary Type CMP equipment) using the slurry composition prepared in Example 3. Herein, the step difference observed was 15,000 Å before the CMP process ($SH_i$), and was decreased to 1,000 Å after the CMP process ($SH_f$). The degree of planarity obtained by applying the $SH_i$ and $SH_f$ values to the Equation 1 was 0.93.

Example 8

A CMP process was performed on surface of an interlayer dielectric film with a hard pad at polishing pressure of 3 psi and at table revolution rate of 80 rpm (Rotary Type CMP equipment) using the slurry composition prepared in Example 4. Herein, the step difference was 15,000 Å before the CMP process ($SH_i$), and was decreased to 800 Å after the CMP process ($SH_f$). The degree of planarity obtained by applying the $SH_i$ and $SH_f$ values to the Equation 1 was 0.95.

As described above, since the slurry composition for CMP process with high-planarity of the present invention can remove more than 90% of the step difference through CMP process. Furthermore, it can be useful for fabrication of semiconductor devices having a fine circuit pattern with a circuit line width of less than 100 nm that cannot be formed by CMP process using conventional CMP slurry composition.

The foregoing description is given for clearness of understanding only, and no unnecessary limitations should be understood therefrom, as modifications within the scope of the invention may be apparent to those having ordinary skill in the art.

What is claimed is:

1. A slurry composition for chemical mechanical polishing (CMP) of oxide film, the slurry composition comprising water, an abrasive, and an anionic polymeric carbon compound having a molecular weight ranging from $1\times10^5$ to $1\times10^7$, and containing 1,000 to 100,000 carboxyl groups within the carbon compound.

2. The composition of claim 1, wherein the anionic polymeric carbon compound is one or more compounds selected from the group consisting of poly(acrylic acid), poly(acrylic acid-co-maleic acid), poly(methylvinylether-alt-maleic acid), polyacrylamide, poly(acrylamide-co-acrylic acid), polyacrylonitrile, and derivatives thereof.

3. The composition of claim 2, wherein the anionic polymeric carbon compound is poly(acrylic acid) or its derivative.

4. The composition of claim 1, wherein the anionic polymeric carbon compound is present in an amount ranging from 0.01 weight percent (wt. %) to 5.0 wt. %, based on total weight of the composition.

5. The composition of claim 4, wherein the anionic polymeric carbon compound is present in an amount ranging from 0.05 wt. % to 1.5 wt. %, based on total weight of the composition.

6. The composition of claim 1, wherein the abrasive is selected from the group consisting of ceria ($CeO_2$), colloidal silica ($SiO_2$), fumed silica ($SiO_2$), alumina ($Al_2O_3$), and mixtures thereof.

7. The composition of claim 1, wherein particle size of the abrasive ranges from 50 nanometers (nm) to 500 nm.

8. The composition of claim 1, wherein the abrasive is present in an amount ranging from 0.5 wt. % to 20 wt. %, based on total weight of the composition.

9. The composition 1, wherein the composition further comprises a basic compound.

10. The composition of claim 9, wherein the basic compound is selected from the group consisting of potassium hydroxide, ammonium hydroxide, MEA (monoethanol amine), DEA (diethanol amine), TEA (triethanol amine), and mixtures thereof.

11. The composition of claim 1, wherein the composition has a pH of 5.0 to 8.0.

12. A method for polishing a surface of a dielectric film, the method comprising:

(a) forming one or more patterns on a substrate;

(b) filling a dielectric material between patterns to form a dielectric film; and (c) performing a CMP process on the entire surface of the formed dielectric film with a slurry composition comprising water, an abrasive, and an anionic polymeric carbon compound having a molecular weight ranging from $1\times10^5$ to $1\times10^7$, and containing 1,000 to 100,000 carboxyl groups within the carbon compound.

13. The method of claim 12, wherein the CMP process is one selected from the group consisting of shallow trench isolation (STI) CMP process, inter layer dielectric (ILD) CMP process, and inter metallic dielectric (IMD) CMP process.

14. A semiconductor device fabricated by the method of claim 12.

* * * * *